(12) United States Patent
Moon et al.

(10) Patent No.: US 10,058,845 B2
(45) Date of Patent: Aug. 28, 2018

(54) POROUS CARBON PARTICLES AND PREPARATION METHOD THEREOF

(71) Applicant: SOGANG UNIVERSITY RESEARCH FOUNDATION, Seoul (KR)

(72) Inventors: Jun Hyuk Moon, Seoul (KR); Hae Min Yoo, Bucheon-si (KR)

(73) Assignee: Sogang University Research Foundation, Seoul (KR)

( * ) Notice: Subject to any disclaimer, the term of this patent is extended or adjusted under 35 U.S.C. 154(b) by 797 days.

(21) Appl. No.: 14/469,025

(22) Filed: Aug. 26, 2014

(65) Prior Publication Data
US 2015/0048556 A1 Feb. 19, 2015

(30) Foreign Application Priority Data

Feb. 27, 2012 (KR) .................. 10-2012-0019951
Feb. 27, 2013 (KR) .................. 10-2013-0021152

(51) Int. Cl.
| | |
|---|---|
| *C01B 32/05* | (2017.01) |
| *B01J 21/18* | (2006.01) |
| *C01B 33/18* | (2006.01) |
| *C23C 16/40* | (2006.01) |
| *C23C 16/44* | (2006.01) |
| *B01J 37/06* | (2006.01) |
| *B01J 37/08* | (2006.01) |
| *B01J 37/02* | (2006.01) |

(Continued)

(52) U.S. Cl.
CPC .............. *B01J 21/18* (2013.01); *B01J 13/14* (2013.01); *B01J 37/0238* (2013.01); *B01J 37/06* (2013.01); *B01J 37/084* (2013.01); *B01J 37/18* (2013.01); *C01B 32/05* (2017.08); *C01B 33/18* (2013.01); *C23C 16/402* (2013.01); *C23C 16/4417* (2013.01); *H01M 4/9083* (2013.01)

(58) Field of Classification Search
CPC ................................. B01J 21/18; C01B 31/02
See application file for complete search history.

(56) References Cited

U.S. PATENT DOCUMENTS 4,263,268 A    4/1981 Knox et al.

FOREIGN PATENT DOCUMENTS

| JP | 2003-327473 A | 11/2003 |
|---|---|---|
| JP | 2007-039289 A | 2/2007 |

(Continued)

OTHER PUBLICATIONS

Moon et al., "Core-shell diamond-like silicon photonic crystals from 3D polymer templates created by holographic lithography," Optics Express, vol. 14 No. 13, Jun. 2006.*

(Continued)

*Primary Examiner* — Jacob T Minskey
*Assistant Examiner* — Baileigh Kate Darnell
(74) *Attorney, Agent, or Firm* — Greer, Burns & Crain, Ltd.

(57) ABSTRACT

The embodiments described herein pertain generally to a porous carbon particle and a producing method of the porous carbon particle, the producing method includes a step of polymerizing an aromatic monomer to form a polymer particle; a step of cross-linking the polymer particle; a step of coating a silica on a surface of the cross-linked polymer particle; a step of carbonizing the polymer particle coated with the silica.

14 Claims, 6 Drawing Sheets

(51) Int. Cl.
*B01J 37/18* (2006.01)
*B01J 13/14* (2006.01)
*H01M 4/90* (2006.01)

(56) References Cited

FOREIGN PATENT DOCUMENTS

| JP | 2007039289 A | * | 2/2007 | |
|----|----|----|----|----|
| KR | 10-0574030 B1 | | 4/2006 | |
| KR | 10-2009-0104055 A | | 10/2009 | |
| KR | 10-0924214 B1 | | 10/2009 | |
| KR | 100924214 B1 | * | 10/2009 | ............ B01J 21/18 |
| KR | 10-2010-0125798 A | | 12/2010 | |
| KR | 10-2011-0099739 A | | 9/2011 | |
| KR | 10-2013-0012702 A | | 2/2013 | |
| WO | WO 2010/070679 A9 | | 6/2010 | |

OTHER PUBLICATIONS

Barar et al., "Friedel-Crafts Cross-Linking Methods for Polystyrene Modification 3. Preparation and Swelling Characteristics of Cross-Linked Particles," Industrial & Engineering Chemistry Product Research and Development, vol. 22 No. 2, 1983.*
Tao et al., "Off-wafer fabrication and surface modification of asymmetric 3D SU-8 microparticles," Nature Protocols, vol. 1 No. 6, 2006.*
Zou et al., "Model Filled Polymers. VII. Synthesis of Crosslinked Polymeric Beads by Seed Polymerization," Journal of Polymer Science: Part A: Polymer Chemistry, vol. 30, pp. 1463-1475, 1992.*
Blanco et al., "Silicon Onion-Layer Nanostructures Arranged in Three Dimensions," Advanced Materials, pp. 1-5, 2006.*
Miguez et al., "Mechanical stability enhancemnent by pore size and connectivity control in colloidal crystals by layer-by-layer growth of oxide," Chem. Commun., pp. 2736-2377, 2002.*
Int'l. Search report of PCT/KR2013/001596 dated Jun. 1, 2013.

* cited by examiner

POROUS CARBON PARTICLES AND PREPARATION METHOD THEREOF

CROSS-REFERENCE TO RELATED APPLICATION

This application is a continuation of International Patent Application No. PCT/KR2013/001596 filed on Feb. 27, 2013, claiming priority based on Korean Patent Application No. 10-2012-0019951 filed on Feb. 27, 2012, and Korean Patent Application No. 10-2013-0021152 filed on Feb. 27, 2013, the contents of all of which are incorporated herein by reference in their entirety.

TECHNICAL FIELD

The embodiments described herein pertain generally to a porous carbon particle and a producing method of the porous carbon particle.

BACKGROUND

Porous particles or pores of a porous structure can be classified into three (3) types of pores, i.e., micro-pores (less than 2 nm), meso-pores (2 nm to 50 nm), and macro-pores (in excess of 50 nm). Since a porous particle whose pore size is controllable can be used in various fields including catalysts, isolation systems, low dielectric materials, hydrogen storage materials, photonic crystals, electrodes and others, they have been recently spotlighted.

The porous particle or structure can be produced by using various materials such as metal oxide, a semiconductor, metal, a polymer, carbons, or others, and especially, a porous carbon particle can be widely used in various fields since they have merits in an excellent surface property, ionic conductivity, corrosion resistance, and low producing costs and so on.

However, the porous carbon particle exhibits significant difference in efficiency depending on distribution, a size, connectivity, a surface area, and a surface property of pores and others, and in particular, a size of a pore needs to be controlled depending on purposes of use of the porous carbon particle. For example, in case of use for an electrode of a fuel cell, using a porous carbon particle having an overly small pore size increases a specific surface area, and thereby, increasing a loading amount of a catalyst material, but causes the following problem: delivering and diffusion of a reaction gas or others become difficult, and since polymer electrolyte cannot penetrate into the inside of the pore, catalyst use efficiency is decreased, and eventually, a fuel cell having improved performance cannot be produced.

Meanwhile, in order to produce the porous carbon particle, using a template has been conventionally suggested, and for the template, spherical silica, or colloidal crystalline array based on an arranged aggregate of a latex polymer nanoparticle has been used. For example, Korean Patent Application Publication No. 2003-0087761 describes "electrocatalysts for a fuel cell supported by a porous carbon structure having regularly 3-dimensionally arranged spherical pores of a uniform diameter and their preparation method." Specifically, the '761 application describes a method for preparing porous carbon particles by using a template. Further, in recent, there have been efforts to synthesize a porous carbon particle including regularly arranged pores through template cloning using zeolite, a meso porous material, and a colloidal crystal, but when these conventional techniques were used, there was the problem that pores were not regularly arranged and distributed within the produced porous carbon particle, and the pore size could not be controlled according to purposes of use. In addition, when the porous carbon particle was produced by using a template as described above, there were disadvantages in that simplification of processes and reduction of costs were difficult.

SUMMARY

In order to resolve the problems of the conventional technology which produces a porous carbon particle by using a template, the inventors of the present disclosure have completed the present disclosure based on the discovery that an internal pore of a carbon particle is formed through cross-linking of an aromatic monomer particle and coating a silica and that a porous carbon particle can be produced while easily controlling its pore size.

In view of the foregoing, example embodiments provide a producing method of a porous carbon particle having a meso- or micro-pore without using a template and a porous carbon particle produced by the method.

However, the problems sought to be solved by the present disclosure are not limited to the above description and other problems can be clearly understood by those skilled in the art from the following description.

In accordance with a first aspect of the present disclosure, there is provided a producing method of a porous carbon particle including a step of polymerizing an aromatic monomer to form a polymer particle; a step of cross-linking the polymer particle; a step of coating a silica on a surface of the cross-linked polymer particle; a step of carbonizing the polymer particle coated with the silica.

In accordance with a second aspect of the present disclosure, there is provided a spherical porous carbon particle prepared by the producing method of the first aspect of the present disclosure.

In accordance with the example embodiments, while a conventional carbon particle having a meso-pore is produced by injecting a carbon precursor into a template, example embodiments can produce a carbon particle having a meso- or micro-pore without using a template. By producing the porous carbon particle as described above, the porous carbon particle can be produced by easy and economical processes within a short time.

In addition, the internal pore of the porous carbon particle produced in accordance with the example embodiments can be adjusted by a thickness of an inorganic coating material (silica); since the porous carbon particles includes lots of pores, they can provide a large specific surface area; and the pores can be controlled according to purposes of use of the porous carbon particles.

In accordance with the example embodiments, the porous carbon particle may be applied to various fields such as catalysts, photo-catalysts, electrodes, photo-electrodes, sensors, photo-sensors, photo-electric devices, and nano-devices.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
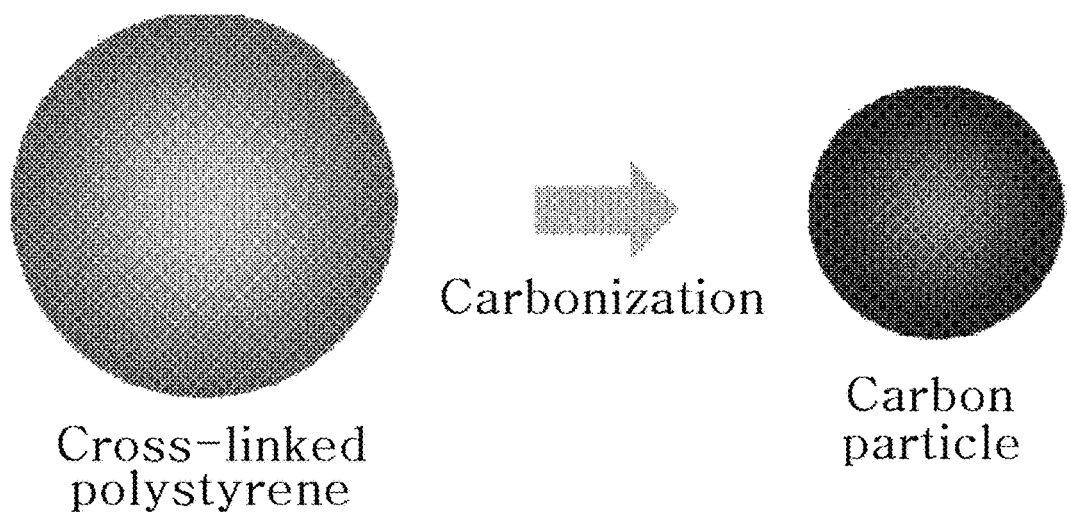
FIG. 1 is a schematic diagram showing a conventional method for producing a spherical porous carbon particle by carbonizing a cross-linked polystyrene particle.

Hereinafter, example embodiments will be described in detail with reference to the accompanying drawings so that inventive concept may be readily implemented by those skilled in the art.

However, it is to be noted that the present disclosure is not limited to the example embodiments but can be realized in various other ways. In the drawings, certain parts not directly relevant to the description are omitted to enhance the clarity of the drawings, and like reference numerals denote like parts throughout the whole document.

Throughout the whole document, the term "comprises" or "includes" and/or "comprising" or "including" used in the document means that one or more other components, steps, operations, and/or the existence or addition of elements are not excluded in addition to the described components, steps, operations and/or elements.

The terms "about", "approximately" or "substantially" used in this document are intended to have meanings close to numerical values or ranges specified with an allowable error and intended to prevent accurate or absolute numerical values disclosed for understanding of the present invention from being illegally or unfairly used by any unconscionable third party. Through the whole document, the term "step of" does not mean "step for."

Throughout the whole document, the description "A and/or B" means "A or B, or A and B."

Hereinafter, example embodiments and Examples of the present disclosure are described in detail with reference to the accompanying drawings.

The first aspect of example embodiments provides a producing method of a porous carbon particle, which includes: a step of polymerizing an aromatic monomer to form a polymer particle; a step of cross-linking the polymer particle; a step of coating a silica on a surface of the cross-linked polymer particle; and a step of carbonizing the polymer particle coated with the silica.

Figure 2:
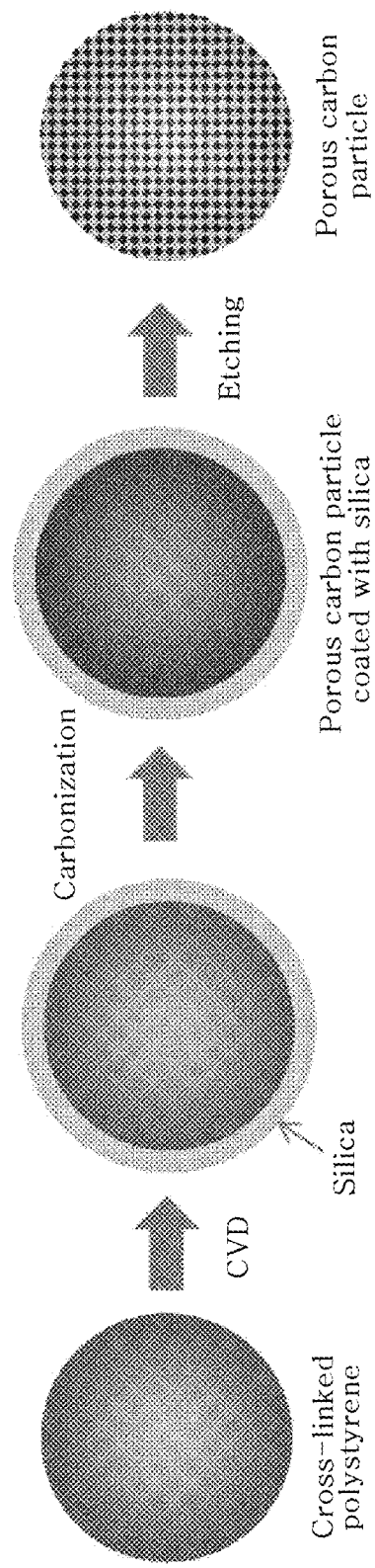
FIG. 2 shows a producing process of a porous carbon particle, which produces a porous carbon particle by coating the exterior of a cross-linked polystyrene particle with silica through a chemical vapor deposition method and carbonizing the particle.

FIG. 1 is a schematic diagram showing a conventionally producing method of a spherical carbon particle by carbonizing a cross-linked polystyrene particle, and FIG. 2 shows a producing process of a porous carbon particle in accordance with an example embodiment, which produces a porous carbon particle by coating the exterior of a cross-linked polystyrene particle with silica by using a chemical vapor deposition method to suppress volume reduction of a particle occurring upon a carbonization process.

In accordance with an example embodiment, the aromatic monomer may include a member selected from the group consisting of styrene, benzamide, butyleneterephthalate, ethyleneterephthalate, a methylmethacrylate-based compound, a vinylpyridine-based compound, and combinations thereof, but may not be limited thereto.

In accordance with an example embodiment, the step of cross-linking the polymer particle may include any cross-linking method known in the art of the present disclosure, and for example, may include cross-linking by Friedel-Crafts alkylation reaction or ultraviolet ray, but the present disclosure may not be limited thereto. For example, the Friedel-Crafts alkylation reaction may be performed by using an alkyl halide in the presence of a Lewis catalyst including $AlCl_3$ or $FeCl_3$, but may not be especially limited thereto. The Lewis acid, the alkyl halide, the condition for the Friedel-Crafts alkylation reaction and others may be properly adopted by one skilled in the art from those known in the art of the present disclosure.

The Friedel-Crafts alkylation reaction is a reaction that can obtain an alkylated product in the presence of a Lewis acid catalyst through an electrophilic aromatic substitution reaction. For example, the Friedel-Crafts alkylation reaction means a reaction, which reacts an aromatic compound including an aromatic ring like benzene ring in the presence of an alkyl halide and a Lewis acid to cause an alkylation in the aromatic ring, and thus a new carbon-carbon bond is formed in the aromatic ring like benzene ring through the reaction. For example, the Friedel-Crafts alkylation reaction may be presented by the following chemical reaction formula:

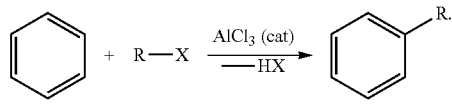

In the above chemical reaction formula, $AlCl_3$ was used as a Lewis acid, and various Lewis acids such as $AlCl_3$ or $FeCl_3$ may be used. In addition, in the above chemical reaction formula, RX means an alkyl halide, and various alkyl halides known in the art of the present disclosure such as $CH_3Cl$, $(CH_3)_2HCCl$, or $(CH_3)_3CCl$ may be generally used.

The mechanism of the Friedel-Crafts alkylation reaction can be described by the following chemical reaction formula, but is not limited thereto:

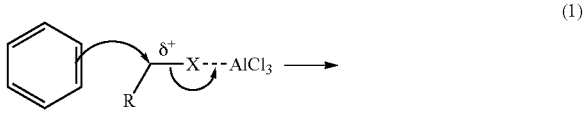

(1)

-continued

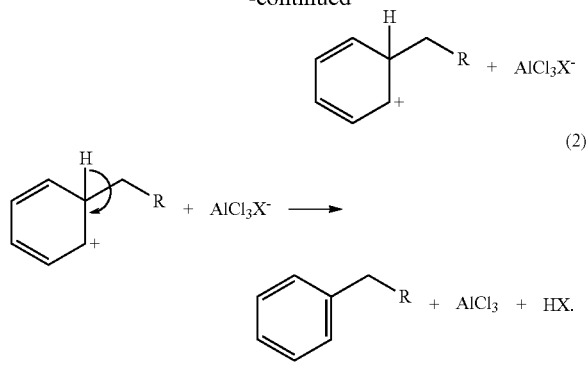

(2)

Specifically, with regard to the Friedel-Crafts alkylation reaction, as shown by above Chemical Reaction Formula (1), an alkyl halide and a Lewis acid like $AlCl_3$ are reacted with each other to form a Lewis acid-base complex, and the Lewis acid-base complex includes a cation of an alkyl group derived from the alkyl halide. Subsequently, the alkyl cation (i.e., a carbonium cation) attacks an aromatic ring having rich electrons, and thereby, forming a cation, in which the alkyl group is bonded to the aromatic ring. Subsequently, as shown by above Chemical Reaction Formula (2), the electrophilic aromatic substitution reaction is completed as the hydrogen atom is removed from the cation, in which the alkyl group is bonded to the aromatic ring, and as a result, the hydrogen atom of the aromatic ring is substituted with the alkyl group so that a new carbon-carbon bond is formed.

In accordance with an example embodiment, the silica coating step may include using a chemical vapor deposition (CVD) method or sol-gel method, but may not be limited thereto.

In accordance with an example embodiment, the chemical vapor deposition (CVD) method may be, for example, low temperature CVD, and may include repeatedly exposing the cross-linked polymer particle to a water vapor and silicon tetrahalide gas at a low temperature to coat the silica on the cross-linked polymer particle, but the present disclosure may not be limited thereto.

In accordance with an example embodiment, the step of carbonizing the polymer particle coated with the silica may include carbonizing the cross-linked polymer by a sintering process, but may not be limited thereto.

In accordance with an example embodiment, the sintering process may be performed at a temperature of from about 500° C. to about 900° C., but may not be limited thereto. A temperature upon the sintering may be properly adopted by those skilled in the art within a sufficient temperature range enough to carbonize the cross-linked polymer particle depending on a type of the polymer used, and for example, the sintering may be performed at a temperature of from about 500° C. to about 900° C., from about 500° C. to about 800° C., from about 500° C. to about 700° C., from about 500° C. to about 600° C., from about 600° C. to about 900° C., from about 700° C. to about 900° C., from about 800° C. to about 900° C., from about 600° C. to about 800° C., or from about 700° C. to about 800° C. But the present disclosure may not be limited thereto.

For example, the cross-linked polystyrene polymer part may be carbonized by the sintering process, but the present disclose may not be limited thereto. For example, the temperature upon the sintering may be used for carbonizing polystyrene (PS) by injecting nitrogen to be used, regularly heating the polystyrene until a temperature reaches to about 700° C., maintaining the temperature of about 700° C. for two (2) hours thereafter, and then, cooling the polystyrene to a room temperature; however, the temperature upon the sintering may be selected by one of ordinary skill in the art within the sufficient cross-linking temperature range.

In accordance with an example embodiment, an amount of an internal pore in the porous carbon particle may be controlled by a thickness of the coated silica, but may not be limited thereto.

In accordance with an example embodiment, the internal pore may include a meso- or micro-pore having a size of about 50 nm or less, but may not be limited thereto. For example, the pore may include a meso- or micro-pore having a size of about 50 nm or less, about 45 nm or less, about 40 nm or less, about 35 nm or less, about 30 nm or less, about 25 nm or less, about 20 nm or less, about 15 nm or less, about 10 nm or less, about 5 nm or less, or about 3 nm or less, but may not be limited thereto.

In accordance with an example embodiment, removing the coated silica may be further included after the step of carbonizing the polymer particle coated with the silica, but may not be limited thereto.

In accordance with an example embodiment, the porous carbon particle may be spherical, but may not be limited thereto.

In accordance with an example embodiment, in order to remove the coated silica, the polymer particle may be immersed in an about 10 wt % hydrogen fluoride solution for one (1) day to be etched, and thereafter, washed with distilled water several times and dried, but may not be limited thereto.

The second aspect of example embodiments provides a spherical porous carbon particle, which is produced by the producing method of the first aspect of example embodiments.

The porous carbon particle in accordance with the example embodiments may be applied to various fields such as catalysts for various uses, catalyst supports, electrodes, devices, and sensors.

Hereinafter, example embodiments are described in more detail by using Examples, but the present disclosure may not be limited to the Examples.

EXAMPLES

Example 1: Production of a Porous Carbon Particle

A porous carbon particle was produced from a polystyrene (PS) particle, and each step for the production is specifically described below:

<Polymerizing Styrene to Form a Polymer>

First, the polystyrene (PS) polymer was formed.

A 2.1 mol styrene monomer and 5 mol distilled water were added into a flask, and nitrogen was injected thereinto while increasing a temperature. After the increase of the temperature, a 0.04 M potassium persulfate aqueous solution was added into the flask. The potassium persulfate was used as an initiator to initiate polymerization for an emulsion polymerization reaction of the styrene. After the addition of the potassium persulfate aqueous solution, 0.007 mol divinylbenzene was added into the flask for a polymerization reaction, and thereafter, the as polymerized particle (PS) was isolated and obtained. The divinylbenzene was used as a linker to form a bond between polystyrenes.

<Cross-Linking the Polymer Particle>

Next, the polymer particle was cross-linked by increasing a bond of the polymer particle through a Friedel-Crafts alkylation reaction. In order to cause the Friedel-Crafts alkylation reaction, a solution obtained by adding 0.01 mol aluminum chloride ($AlCl_3$) as a Lewis acid to 0.25 mol chloroform as alkyl halide was prepared. Thereafter, the polymerized polymer (PS) was added to and reacted with the solution containing chloroform and aluminum chloride to cause the Friedel-Crafts alkylation reaction of the polystyrene (PS) to cross-link the polystyrene. After the reaction was completed, the solution was purified by a centrifuge, and washed with ethanol. Thereafter, the obtained polymer (PS) particle was dispersed in ethanol, and dried in an oven so that the cross-linked polymer (PS) particle was obtained.

<Coating Silica on a Surface of the Polymer Particle>

The cross-linked polymer particle was coated with silica by repeatedly exposing the cross-linked polymer particle to water vapor and silicon tetrachloride gas at a low temperature every five (5) minutes through a low-temperature chemical vapor deposition (low-temperature CVD). In this case, a thickness of the silica coating was adjusted by controlling the number of times for the exposure to the gas.

<Carbonizing the Particle by Putting the Particle Coated with Silica Into a Sintering Furnace>

After the particle coated with silica was put into a sintering furnace, the particle was homogeneously heated while injecting nitrogen until the temperature reached 700° C. Thereafter, the temperature of 700° C. was maintained for two (2) hours and cooled to a room temperature to carbonize the polystyrene (PS) in the particle coated with the silica, and simultaneously, to suppress the volume reduction of the particle so that a spherical porous carbon particle was obtained.

In order to remove the coated silica from the particle that has completed the carbonization process, the particle was immersed in a 10 wt % hydrogen fluoride solution for one (1) day. Thereafter, the particle was washed with distilled water several times and dried.

Comparative Example 1 Production of a Carbon Particle

A carbon particle was produced by performing the same process as that of Example 1, except for the silica coating process.

Experimental Example 1: Structural Analysis of the Porous Carbon Particle

Figure 3:
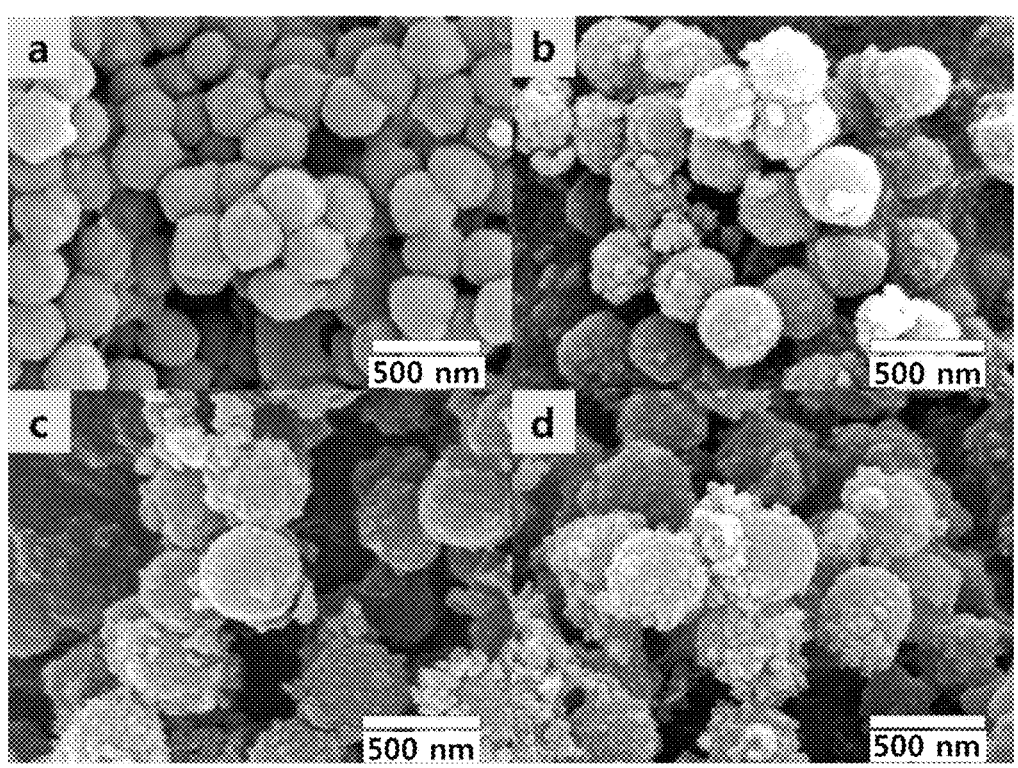
FIG. 3 shows scanning electron microscopy (SEM) photographs of a porous carbon particle produced in accordance with a Comparative Example and Examples of the present disclosure: a. a carbon particle produced without a silica coating; b. a porous carbon particle produced after a 10 nm silica coating; c. a porous carbon particle produced after a 20 nm silica coating; and d. a porous carbon particle produced after a 30 nm silica coating.
Figure 4:
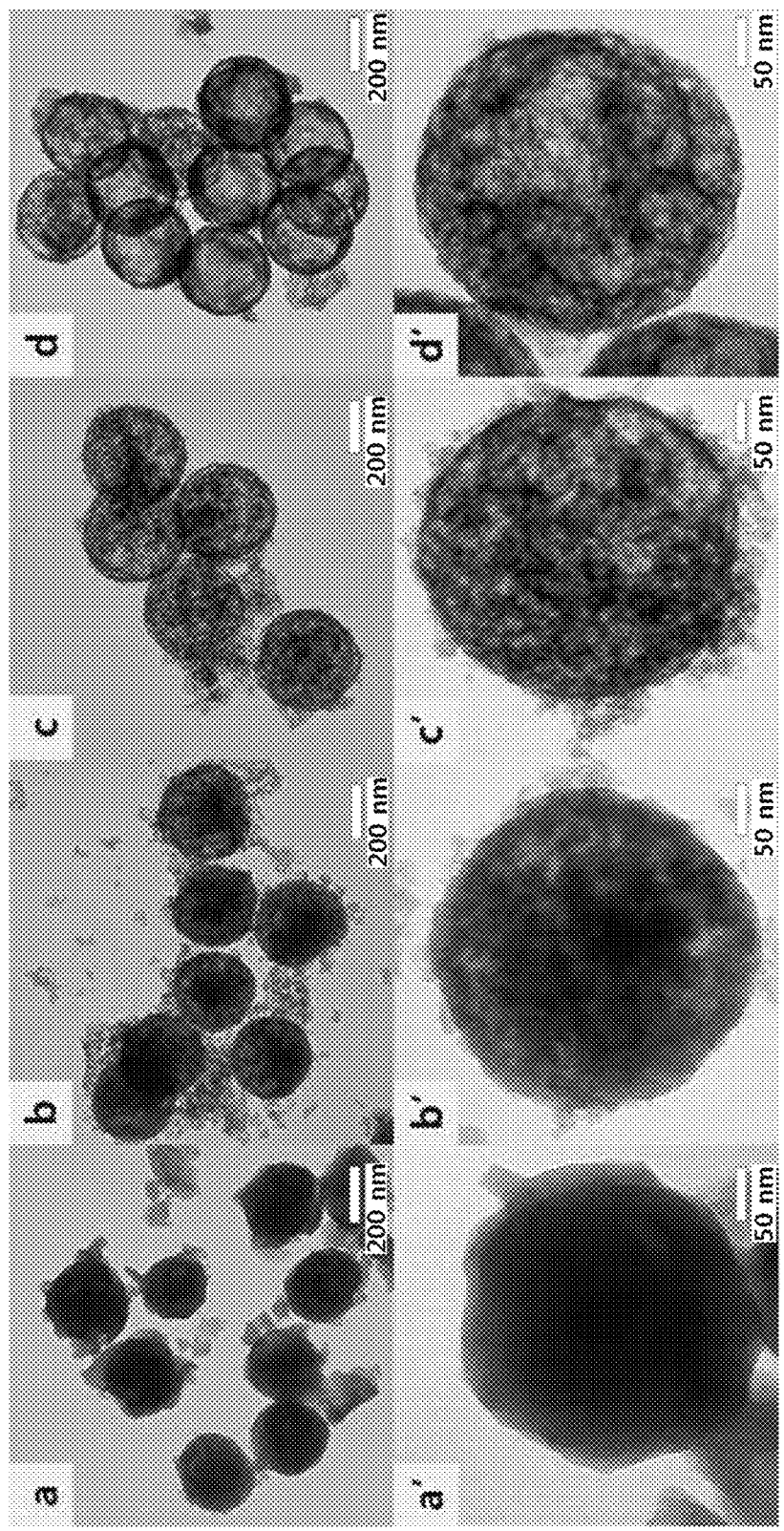
FIG. 4 shows transmission electron microscopy (TEM) photographs of a porous carbon particle produced in accordance with a Comparative Example and Examples of the present disclosure; a. and a'. carbon particles without a silica coating; b and b'. porous carbon particles produced after a 10 nm silica coating; c and c'. porous carbon particles produced after a 20 nm silica coating; and d. and d'. porous carbon particles produced after a 30 nm silica coating.

FIG. 3 and FIG. 4 show SEM and/or TEM photographs of a carbon particle produced without a silica coating (Comparative Example 1), and a porous carbon particle produced after a 10 nm silica coating, a porous carbon particle produced after a 20 nm silica coating, and a porous carbon particle produced after a 30 nm silica coating, among the process in accordance with Example 1.

Figure 5A:
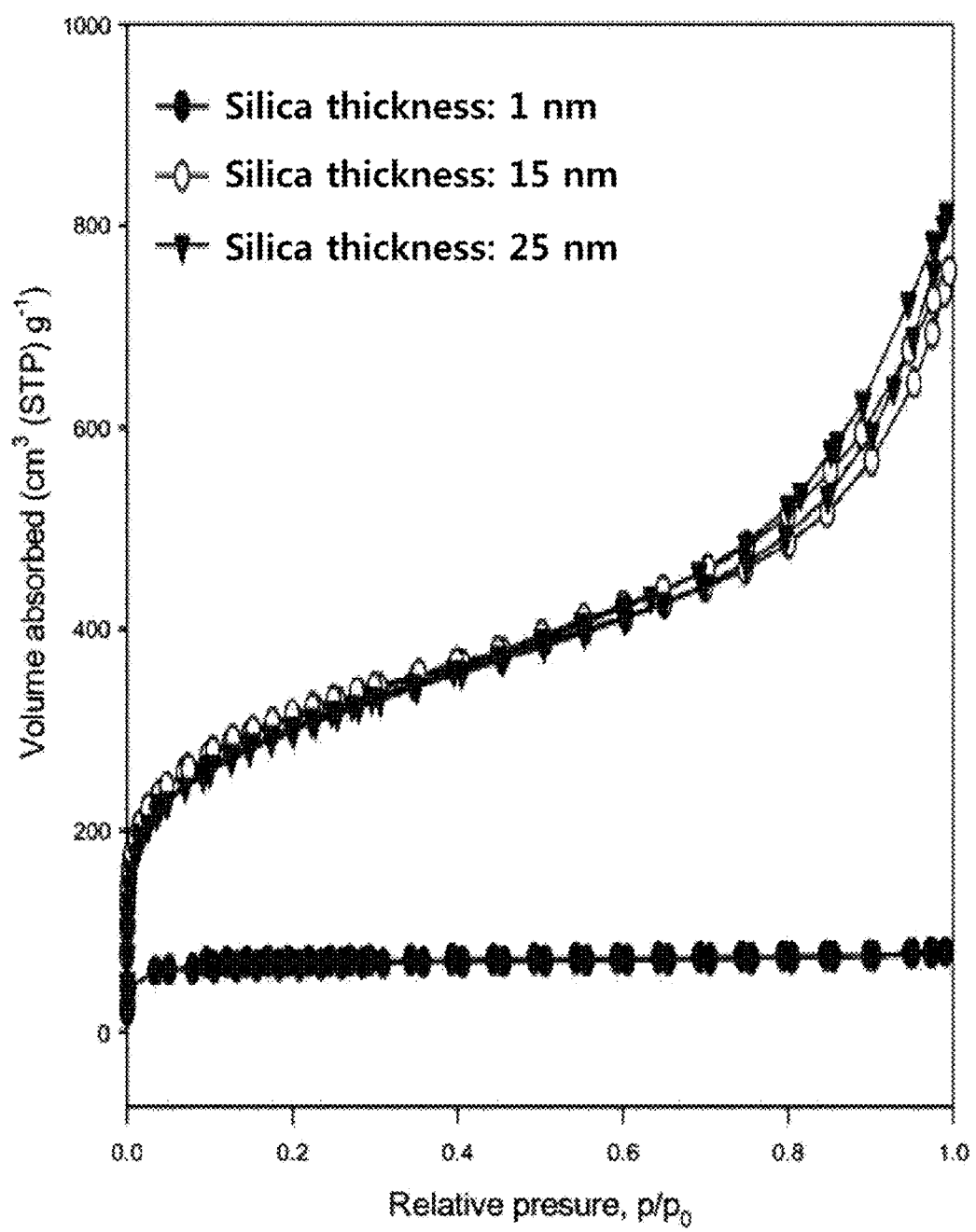
FIGS. 5A and 5B are a nitrogen adsorption isotherm and a pore distribution curve of a porous carbon particle produced in accordance with an example embodiment.
Figure 5B:
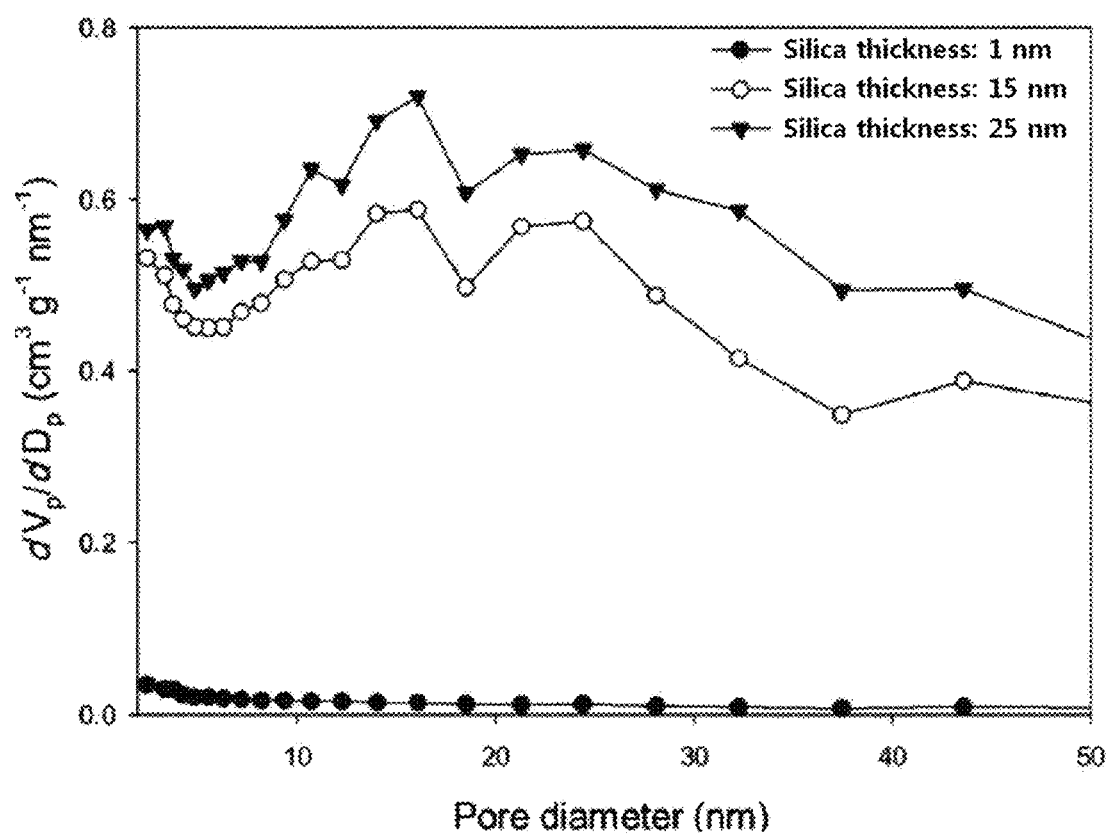

Experimental Example 2: Analysis of a Nitrogen Adsorption Isotherm and a Pore Distribution Curve of the Porous Carbon Particle By analyzing a nitrogen adsorption isotherm (FIG. 5A) and a pore distribution curve (FIG. 5B) of the carbon particle produced according to Comparative Example 1 and the porous carbon particle produced according to Example 1, it was identified that volume reduction of the particle during the carbonization process is decreased as the thickness of the silica coating increases, and an amount of nitrogen adsorption and desorption increases due to increase of pores. This implies that the internal pore of the carbon particle is widely distributed as a meso-pore having a size of 50 nm or less or a micro-pore having a size of several nanometers.

With reference to the experimental data, i.e., FIG. 3, FIG. 4, FIG. 5A and FIG. 5B, in case of a carbon particle produced by a conventional method, which produces a spherical carbon particle by carbonizing a cross-linked polystyrene particle as in Comparative Example 1, a size of the particle prior to the carbonization was 450 nm, but about 300 nm when the particle was carbonized, which means that the volume reduction of 66% occurred. To the contrary, in the case where a porous carbon particle is produced through a process of coating silica on a surface of a cross-linked polymer particle as in Example 1, the exterior of the cross-linked polystyrene particle is coated with silica by using a chemical vapor deposition method, and thereby, suppressing volume reduction of the particle occurring upon the carbonization process, so that only the volume reduction of maximum 10% or less occurred. These results confirm that more pores may be formed in the inside of the particle due to the decrease of the volume reduction, and the amount of the internal pore can be adjusted depending on a thickness of the coated silica.

That is, a porous carbon particle having a meso-pore can be produced without using a template, and the internal pore of the carbon particle can be adjusted depending on a thickness of the inorganic coating material (silica).

The above description of the example embodiments is provided for the purpose of illustration, and it would be understood by those skilled in the art that various changes and modifications may be made without changing technical conception and essential features of the example embodiments. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the example embodiments. It shall be understood that all modifications and embodiments conceived from the meaning and scope of the claims and their equivalents are included in the scope of the inventive concept.

We claim:

1. A method of producing a porous carbon particle, the method comprising:
   polymerizing an aromatic monomer to form a polymer particle;
   cross-linking the polymer particle;
   coating a silica on a surface of the cross-linked polymer particle;
   carbonizing the polymer particle coated with the silica to provide the porous carbon particle; and,
   removing the coated silica after carbonizing the polymer particle coated with the silica,
   wherein an amount of internal pores in the porous carbon particle is controlled by a thickness of the coated silica, and
   wherein a volume reduction of the particle during the carbonization process is decreased as the thickness of the silica coating increases, and thus the amount of internal pores in the porous carbon particle increases.

2. The method of claim 1, wherein the aromatic monomer includes a member selected from the group consisting of styrene, benzamide, butyleneterephthalate, ethyleneterephthalate, a methylmethacrylate-based compound, a vinylpyridine-based compound, and combinations thereof.

3. The method of claim 1, wherein the cross-linking the polymer particle includes cross-linking the polymer particle by Friedel-Crafts alkylation reaction or ultraviolet ray.

4. The method of claim 3, wherein the Friedel-Crafts alkylation reaction is performed by using an alkyl halide in the presence of a Lewis acid catalyst including $AlCl_3$ or $FeCl_3$.

5. The method of claim 1, wherein the coating a silica is performed by using a chemical vapor deposition method or sol-gel method.

6. The method of claim 5, wherein the chemical vapor deposition method includes repeatedly exposing the cross-linked polymer particle to a water vapor and silicon tetra-halide gas to coat the silica on the cross-linked polymer particle.

7. The method of claim 1, wherein the carbonizing the polymer particle coated with the silica includes carbonizing the cross-linked polymer by a sintering process.

8. The method of claim 7, wherein the sintering process is performed at a temperature of from 500° C. to 900° C.

9. The method of claim 1, wherein the internal pore includes a meso-pore or micro-pore having a size of 50 nm or less.

10. The method of claim 1, wherein the porous carbon particle is spherical.

11. A method of producing a porous carbon particle, the method comprising:

cross-linking a polymer particle formed from a polymerized aromatic monomer;

coating a silica on a surface of the cross-linked polymer particle by using a chemical vapor deposition method or sol-gel method;

carbonizing the polymer particle coated with the silica to provide a porous carbon particle; and, removing the coated silica after carbonizing the polymer particle coated with the silica, wherein an amount of internal pores in the porous carbon particle is controlled by a thickness of the coated silica, and wherein a volume reduction of the particle during the carbonization process is decreased as the thickness of the silica coating increases, and thus the amount of internal pores in the porous carbon particle increases.

12. The method of claim 11 further comprising:

adjusting a thickness of the coated silica in order to control an internal pore in the porous carbon particle.

13. The method of claim 11 wherein the chemical vapor deposition method includes repeatedly exposing the cross-linked polymer particle to a water vapor and silicon tetra-halide gas to coat the silica on the cross-linked polymer particle.

14. The method of claim 11 wherein the porous carbon particle is produced without a template.

\* \* \* \* \*